United States Patent [19]
Nelson

[11] Patent Number: 5,087,794
[45] Date of Patent: Feb. 11, 1992

[54] THERMOSTAT GUARD

[75] Inventor: Clifford L. Nelson, Minneapolis, Minn.

[73] Assignee: Honeywell Inc., Minneapolis, Minn.

[21] Appl. No.: 554,769

[22] Filed: Jul. 19, 1990

[51] Int. Cl.[5] .................. H05K 5/00; B65D 55/14
[52] U.S. Cl. ............................. 174/52.1; 70/158; 70/171
[58] Field of Search ............ 174/52.1, 50; 374/208, 374/209, 194; 220/210, 913; 361/380, 381, 383; 70/158, 163, 164, 165, 166, 167, 168, 169, 170, 171, 172, 173

[56] References Cited

U.S. PATENT DOCUMENTS

| | | | |
|---|---|---|---|
| 4,295,180 | 10/1981 | Herron et al. | 361/383 |
| 4,470,518 | 9/1984 | Stein | 220/346 |
| 4,716,499 | 12/1987 | Bhargava | 361/395 |
| 4,717,216 | 1/1988 | Hornak | 312/257 R |

Primary Examiner—Leo P. Picard
Assistant Examiner—Bot Ledynh
Attorney, Agent, or Firm—Charles L. Rubow

[57] ABSTRACT

A thermostat guard including a ventilation scheme that allows air flow to the thermostat, while preventing the insertion of tools through ventilation holes to adjust the thermostat. The thermostat guard provides a locked enclosure for a thermostat so as to prevent unauthorized adjustments.

10 Claims, 3 Drawing Sheets

THERMOSTAT GUARD

BACKGROUND OF THE INVENTION

This invention pertains to a thermostat guard that protects a thermostat from unauthorized adjustments, while providing the necessary ventilation for proper thermostat operation.

In many situations it is desirable to prevent unauthorized persons from tampering with thermostat settings. This is particularly true for large buildings and public places where a large number of people are present.

In the past, protection was accomplished by placing a locked cover over the thermostat. To insure proper operation, ventilation holes were placed in the sides and/or top of this cover. Nothing prevented a resourceful individual from inserting some type of tool through the ventilation holes and adjusting the thermostat.

Prior art shows different schemes to prevent unauthorized adjustment through ventilation holes. One type of ventilation scheme is to have two walls with ventilation holes in each wall that are offset from one another. Yet another scheme is to place a solid "half wall" immediately inside the ventilated portion of the cover. This was accomplished by placing a series of baffles in the cover of the guard.

SUMMARY OF THE INVENTION

The present invention is a locked thermostat guard with means to prevent the insertion of tools through the ventilation holes to make unauthorized adjustments to the enclosed thermostat, and yet provide adequate ventilation to insure proper thermostat operation. This is accomplished by placing all of the ventilation holes in the outside wall of the base member, while a second, solid wall is placed between the thermostat and the ventilation holes. The top of the solid wall is left open to allow air to flow over the top of this member.

DESCRIPTION OF THE PREFERRED EMBODIMENT

Figure 1:
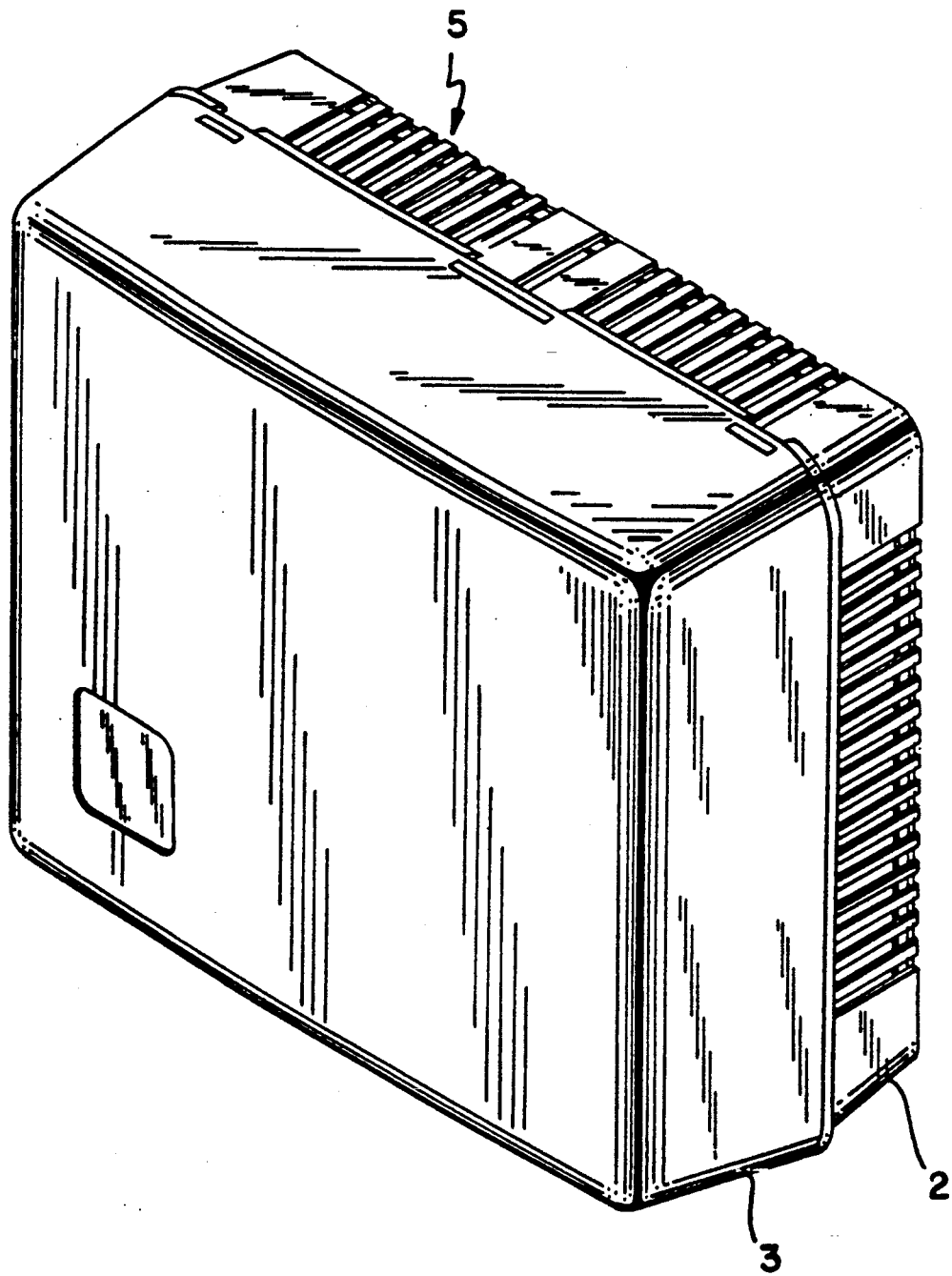
FIG. 1 is a perspective view of the Thermostat Guard.
Figure 4:
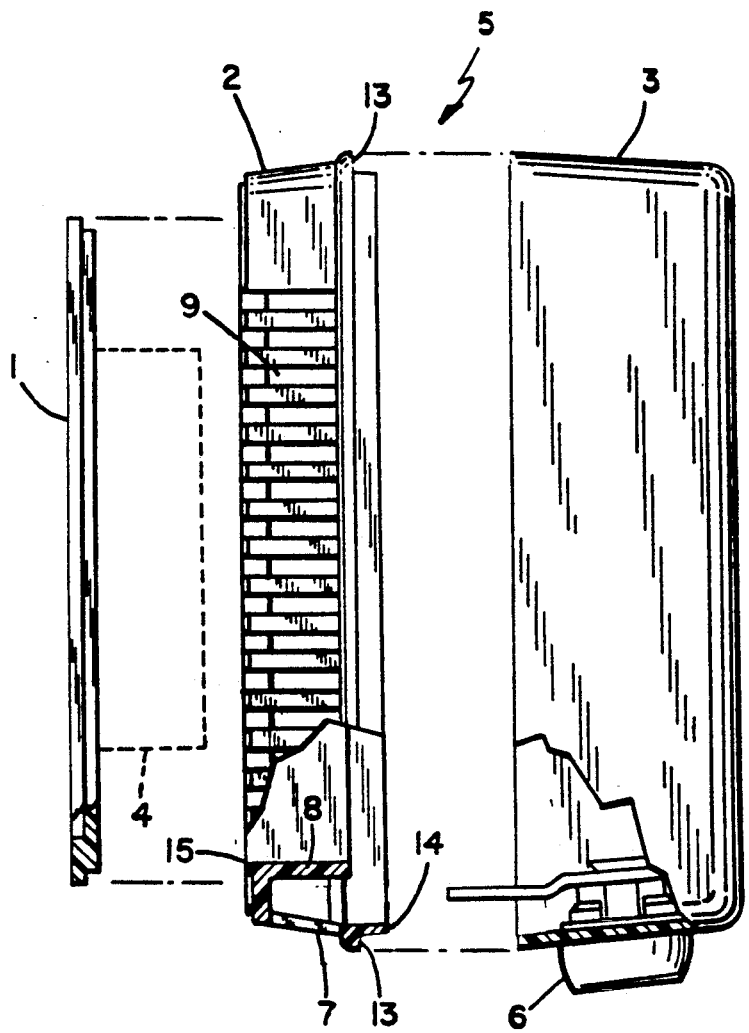
FIG. 4 shows a side view of each of the parts of the Thermostat Guard.
Figure 5:
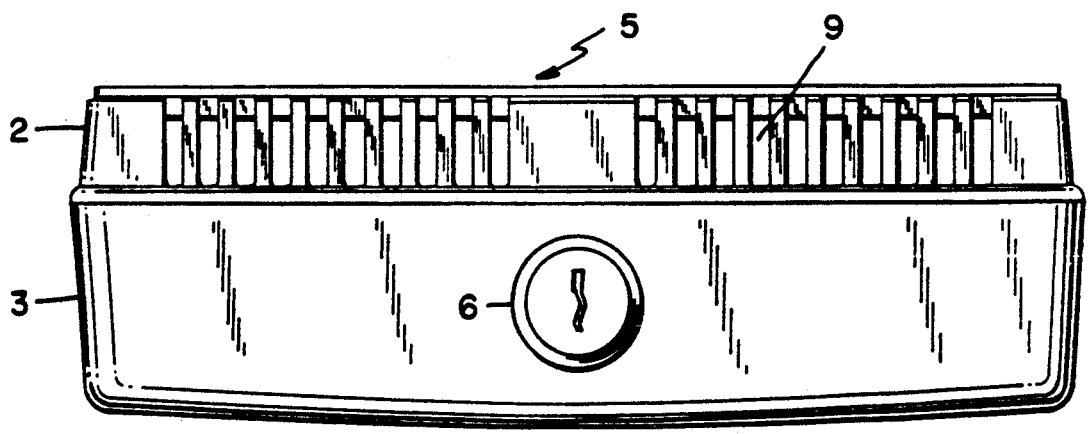
FIG. 5 is a bottom view of the Thermostat Guard.

The thermostat guard 5 as shown in FIGS. 1 and 4 consists of a back plate 1, a base 2, a cover 3, and a locking mechanism 6. These parts are combined to provide a locked enclosure for a thermostat with sufficient ventilation to ensure proper operation of the thermostat.

The back plate 1 is a single, flat piece which mounts between thermostat 4 and the wall. This plate 1 is designed to facilitate a number of different thermostats. Also, back plate 1 forms a covering for any electrical fixtures or mars in the wall, directly behind the thermostat. Plate 1 fits into grooves 15 around the opening 16 in the back of base 2 to form a flush surface when base 2 is mounted to the wall using screws through the corner holes 10.

Base member 2 is the critical part of the present invention. Holes, slots or openings 9 in an outside wall 7 around the periphery of base 2 allow air flow to the thermostat. In order to prevent individuals from inserting tools through these ventilation holes 9, a solid inner wall 8 running substantially parallel to outside wall 7 around the periphery of base 2 is placed inside wall 7. The top of solid inner wall 8 is left open to allow air flow through the ventilation holes 9 and over the top of this solid inner wall 8 thus reaching the thermostat.

It may be possible for resourceful individuals to access the thermostat by routing a tool through the ventilation holes 9 and over the solid inner wall 8; however, a compromise must be made. It is crucial that air flow to the thermostat be restricted as little as possible.

The base member 2 has an outer ledge 15 on the top of the ventilated wall onto which the cover 3 fits. Additionally, a structure is provided to facilitate the locking means.

Figure 2:
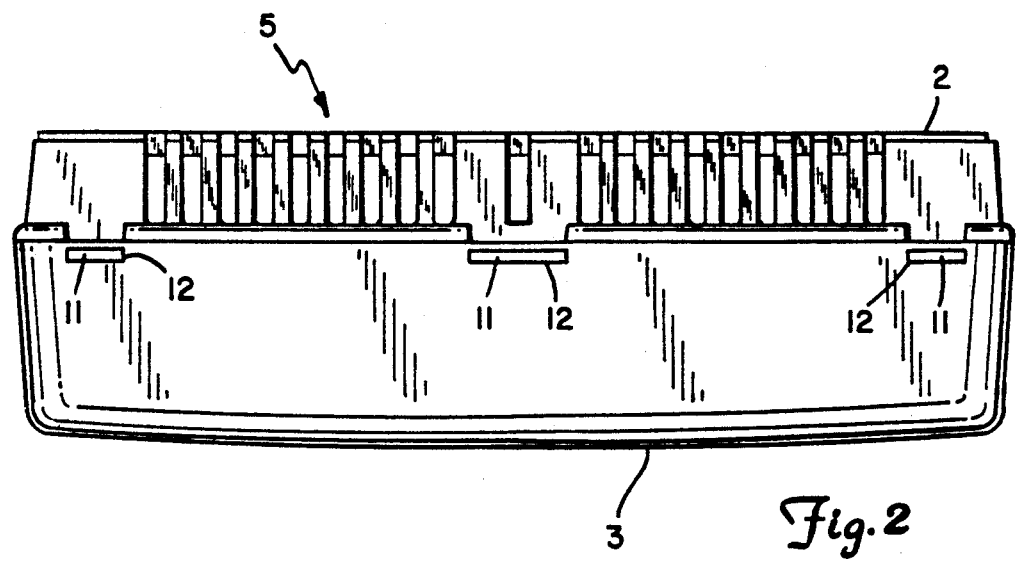
FIG. 2 shows a top view of the Thermostat Guard.
Figure 3:
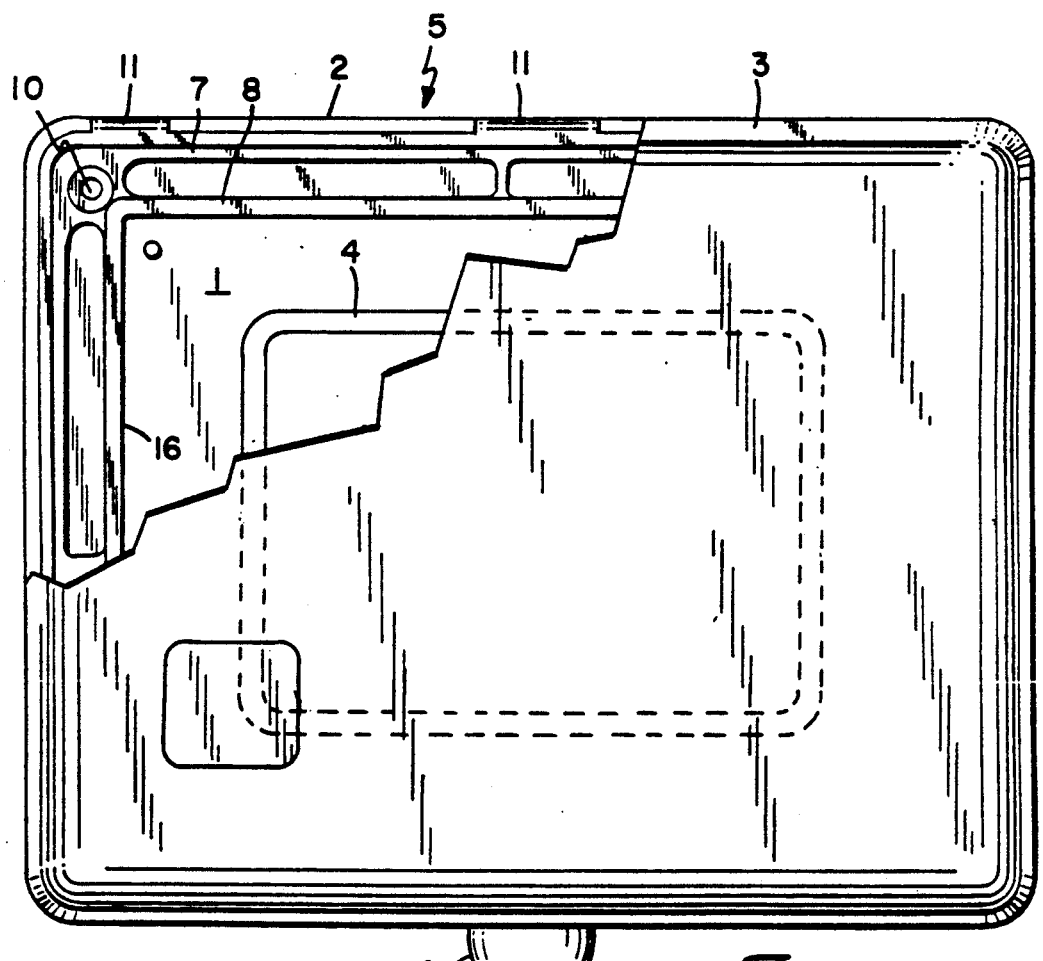
FIG. 3 shows a front view of the Thermostat Guard with a corner cut out to show the structure of the base member.

Cover 3 is also a solid piece with a locking means 6 attached thereto. Cover 3 has a plurality of slots 12 near the edge of one side. (see FIG. 2) Base member 2 has a plurality of tabs 11 which fit into the corresponding slots 12 of cover 3. Cover 3 then swings down over the base 2, fitting around the upper lip 14 of base member 2 and resting upon outer ledge 13. The locking means can then be closed, securing the cover 3 in place.

The thermostat guard or cover 3 could be constructed from metal or plastic, and could be made transparent or opaque.

The thermostat guard shown is one size made, and can be made in other sizes.

The embodiments of the invention in which an exclusive property or right is claimed are defined as follows:

1. A thermostat guard for protecting a thermostat from unauthorized adjustment, comprising:
   a base member adapted to be mounted on a support surface, wherein the base member has an outer wall having ventilation holes therein, a solid inner wall, of which portions are positioned so as to block access to the thermostat, and a bottom wall which has an opening through which the thermostat will fit; and
   a cover member with locking means, capable of being secured to a front side of base member.

2. The thermostat guard of claim 1 wherein said inner wall is a distance from the ventilation holes of said outer wall to allow air flow through said ventilation holes and around said inner wall.

3. The thermostat guard of claim 2 wherein said cover member attaches to the base member by means of complimentary slots and tabs on the cover and base member.

4. The thermostat guard of claim 1 further including a back plate on which the thermostat may be mounted, said back plate being sized and configured to close the opening in the bottom wall of said base member.

5. The thermostat guard of claim 4 wherein the opening in said base member is formed with a recessed perimeter so that said back plate is completely enclosed by said base member when said base member is mounted on the support surface.

6. A thermostat guard for protecting a thermostat from unauthorized adjustments comprising;
   a base member adapted to be mounted on a support surface, the base member including a bottom wall and side walls around the perimeter of the bottom wall, the bottom wall having an opening therein through which a thermostat will pass, the side walls having ventilation holes formed therein, said base member further including an inner wall of which portions are adapted to block access to the thermostat through the ventilation holes in the side walls; and a cover member with locking means sized and configured to attach to said base member and form a top wall, whereby said base member and said cover member cooperate to provide an enclosure.

7. The thermostat guard of claim 6 wherein the inner wall of said base member is spaced from the ventilation holes in said outer wall so as to allow air flow through the ventilation holes, around said inner wall and through the enclosure.

8. The thermostat guard of claim 7 wherein said cover member attaches to the base member by means of complimentary slots and tabs on said cover and said base member.

9. The thermostat guard of claim 6 further including a back plate on which the thermostat may be mounted, said back plate being sized and configured to close the opening in the bottom wall of said base member.

10. The thermostat guard of claim 9 wherein the opening in the bottom wall of said base member is formed with a recessed perimeter so that the bottom wall of said base member and said back plate provide a flush exterior surface.

* * * * *